United States Patent [19]

Ikeda et al.

[11] Patent Number: 4,866,230
[45] Date of Patent: Sep. 12, 1989

[54] METHOD OF AND APPARATUS FOR CONTROLLING FLOATING ZONE OF SEMICONDUCTOR ROD

[75] Inventors: Yasuhiro Ikeda; Kunio Suzuki, both of Annaka; Masataka Watanabe, Nigata; Nobuhiro Ohara, Joetsu, all of Japan

[73] Assignee: Shin-Etu Handotai Company, Limited, Tokyo, Japan

[21] Appl. No.: 132,191

[22] Filed: Dec. 11, 1987

[30] Foreign Application Priority Data

Apr. 27, 1987 [JP] Japan .................. 62-104082
Apr. 27, 1987 [JP] Japan .................. 62-104083
Apr. 27, 1987 [JP] Japan .................. 62-104085

[51] Int. Cl.$^4$ .................. H05B 5/00; H05B 5/08
[52] U.S. Cl. .................. 219/10.43; 219/10.77; 373/139; 156/615; 156/617.1; 364/477; 382/8
[58] Field of Search .................. 219/10.41, 10.43, 10.67, 219/10.75, 10.77; 373/138, 139; 156/604, 608, 615, 617.1; 356/384; 364/477; 382/8

[56] References Cited

U.S. PATENT DOCUMENTS

| | | | |
|---|---|---|---|
| 2,992,311 | 7/1961 | Keller | 219/10.43 X |
| 3,198,929 | 8/1965 | Stut | 219/10.43 X |
| 3,243,509 | 4/1966 | Stut | 373/139 X |
| 3,757,071 | 9/1973 | Stut | 219/10.43 |
| 3,814,827 | 6/1974 | Stut | 373/139 |
| 4,162,367 | 7/1979 | Ticak et al. | 373/139 |

FOREIGN PATENT DOCUMENTS

| | | |
|---|---|---|
| 2731250 | 7/1977 | Fed. Rep. of Germany . |
| 7209619 | 3/1972 | France . |
| 7619927 | 6/1976 | France . |

Primary Examiner—A. D. Pellinen
Assistant Examiner—David Osborn
Attorney, Agent, or Firm—Browdy and Neimark

[57] ABSTRACT

In a method of controlling a floating zone of a semiconductor rod of the present invention shown in FIG. 1, the diameter $D_s$ at a crystallization boundary of a crystal and the axial length of the floating zone are indirectly controlled by controlling a diameter $D_m$ of a crystallizing-side melt shoulder portion and the diameter $D_n$ of a constricted melt portion, respectively. Since these diameters $D_m$ and $D_n$ are used for predicting $D_s$ and L to be obtained after a given time has passed, the response speed and stability of the control are improved as compared with the direct control of $D_s$ and L. An apparatus for controlling a floating zone of a semiconductor rod of the present invention performs the above-described method. In another method, the zone length is directly or indirectly controlled by regulating a relative moving speed of the melting-side semiconductor rod relative to the heater, and the diameter $D_s$ at the crystallization boundary of the crystal is directly or indirectly controlled by regulating the electrical power supplied to the heater.

12 Claims, 7 Drawing Sheets

METHOD OF AND APPARATUS FOR CONTROLLING FLOATING ZONE OF SEMICONDUCTOR ROD

BACKGROUND OF THE INVENTION

1. Field of the Invention

The present invention relates to a method of and an apparatus for controlling a floating zone of a semiconductor rod and more particularly relates to an apparatus for producing semiconductor monocrystals by a floating zone method which controls the length of the floating zone and the diameter of a crystallizing crystal.

2. Description of the Prior Art

Figure 6:
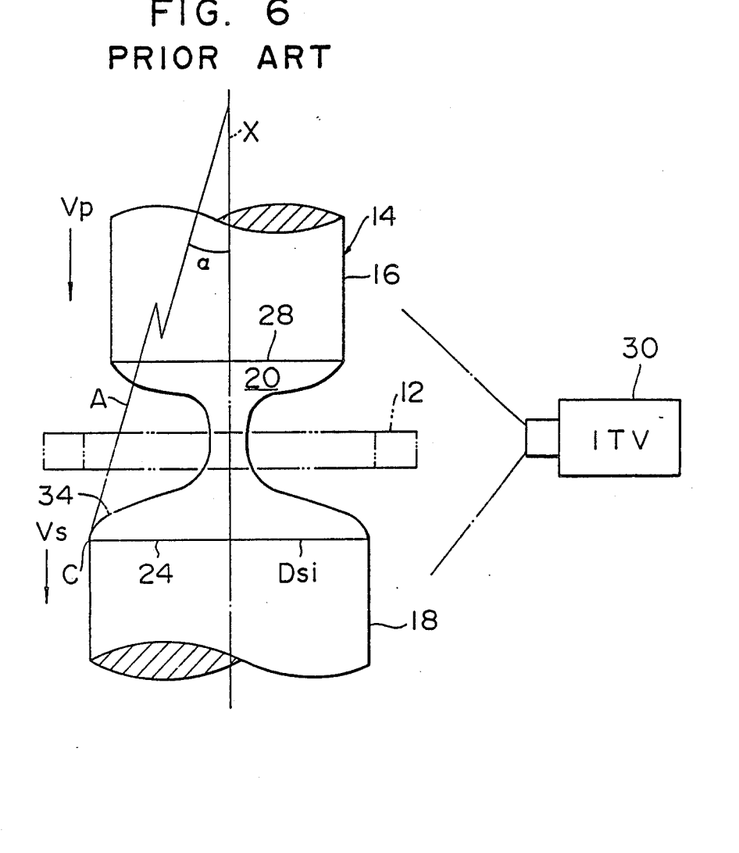
FIG. 6 is an explanatory view of a conventional control method.

In the prior art shown in FIG. 6, a floating zone 20 (melting zone) is formed between a semiconductor rod 16 on a melting side (a polycrystalline rod as a raw material) and a semiconductor rod 18 on a crystallizing side (a monocrystalline rod as a product) by supplying a high-frequency current to an induction heating coil 12, and the floating zone 20 and the adjacent space thereof are monitored by an industrial television camera 30 so as to detect the position of a crystallization boundary 24 and the diameter $D_s$ of the crystallization boundary of a crystal from composite picture signals from the television camera, as well as an angle $\alpha$ between a tangent A at a point C in the periphery of the crystallizing boundary and the axis X of a semiconductor rod 14. In operation, the diameter of the crystallizing crystal has been controlled by adjusting the downward velocity $V_p$ of the melting-side semiconductor rod in accordance with the value of the angle $\alpha$.

Figure 7:
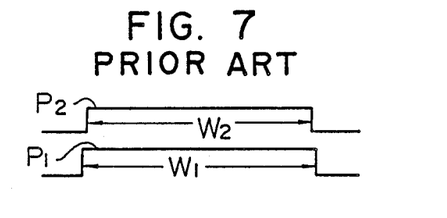
FIG. 7 is a chart showing the waveforms of luminance signals for explaining the detection accuracy of the angle shown in FIG. 6.

The diameter $D_s$ at the crystallization boundary of the crystal is determined as a value which is proportional to a pulse width $W_1$ of a pulse $P_1$ of a luminance signal, as shown in FIG. 7, of a scanning line corresponding to the crystallization boundary 24. The angle $\alpha$ is determined from the difference between pulse widths $W_1$ and $W_2$ of pulses $P_1$ and $P_2$ of the luminance signals on this scanning line and a scanning line above it (refer to U.S. Pat. No. 3,757,071).

However, since it is necessary to determine the difference between the pulse width $W_1$ and the pulse width $W_2$ for adjacent scanning lines which are very close to each other, this small difference contains a large relative error factor and impairs the accuracy of detection of the angle $\alpha$. In addition, since the error in detection of the position of the crystallizing boundary 24 is as large as 50% of the single interval of the scanning line, the accuracy of detection of the angle $\alpha$ is further deteriorated. It is also to be understood that, when there is a crystalline facet line near the point C, the detection accuracy is lowered even further.

Therefore, even if the diameter $D_s$ of the crystallization boundary of the crystal at a future time is predicted from the angle $\alpha$, the degraded prediction makes the ability to control the diameter $D_s$ of the crystallizing crystal poor.

Figure 8:
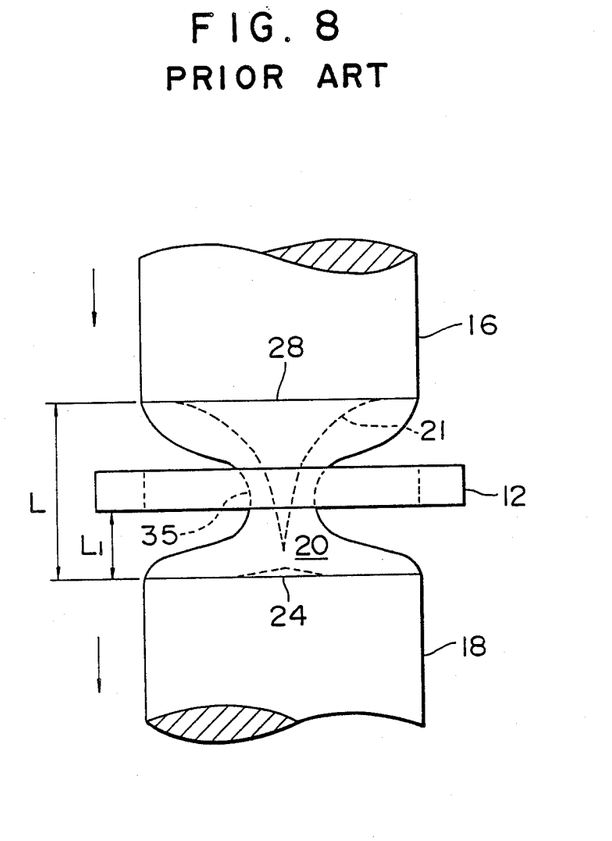
FIG. 8 is a drawing explaining the problems encountered by the conventional control method.

In addition, even if the diameter of the growing crystal alone is controlled, there still are the following problems:

(1) As shown in FIG. 8, an unmelted cone 21 which is not yet molten and invisibly projects from the center of the bottom of the melting-side semiconductor rod 16 is present in the floating zone 20 that is formed by the induction heating coil 12 between the melting-side semiconductor rod 16 which moves downward and the crystallizing-side semiconductor rod 18. When a zone length L1 on the crystallizing side which is a distance between the induction heating coil 12 and the crystallizing boundary 24 is therefore decreased, and, if the lower end of the unmelted cone 21 is near the crystallization boundary 24, the temperature at the center of the crystallization boundary 24 becomes lower than the peripheral portion and the crystallization speed is thus locally increased, resulting in the occurrence of a dislocation or polycrystallization in an extreme due to the rise in the center of the boundary.

(2) When the cooling of the crystallization boundary 24 progresses further, the center thereof rises and the lower end of the unmelted cone 21 is brought into contact with the top of the crystallization boundary 24, the monocrystalline semiconductor rod 18 on the crystallizing side adhering to the polycrystalline semiconductor rod 16 on the melting side. Therefore, it is impossible to continue the floating zone method.

(3) Conversely, a zone length L which represents the axial length of the floating zone 20 becomes too long, the diameter of a constricted melt portion 35 is reduced, and the floating zone 20 is separated at the position of the constricted melt portion 35 by the surface tension, the melt consequently dropping.

(4) When gaseous impurities are injected into the floating zone 20 from the surface thereof (gas doping), or the impurities in the floating zone 20 are removed in a vacuum atmosphere (vacuum method), since the surface area of the floating zone 20 changes with the change in the zone length L, the doping or removal speed of the impurities changes and thus the resistivity of the semiconductor rod 18 on the crystallizing side becomes non-uniform in the axial direction.

On the other hand, if the electrical power supplied to the induction heating coil 12 is changed, the diameter $D_s$ at the crystallization boundary of the crystal and the zone length L also change. In addition, the diameter $D_s$ at the crystallization boundary of the crystal and the zone length L also are changed by a change in the downward velocity of the semiconductor rod 18 on the crystallizing side.

If the responsiveness of the control is poor or stable control cannot be achieved, the zone length becomes too short or too long, and thus the above-described crystal dislocation or adhesion occurs or the floating zone is cut. As a result, the quality of a product deteriorates or the floating zone method cannot be continued. In the cone portion in the initial state of crystal growth, even when there is no problem with respect, for example, to quality, the excessive zone length causes the cone length to be unnecessarily increased and results in product losses.

It is therefore highly desirable to provide a method of adjusting the amount of electrical power supplied to the induction heating coil 12 and the downward velocities of the crystallizing-side semiconductor rod 18 and the melting-side semiconductor rod 16 (and the relative velocity therebetween) so that the zone length L and the diameter $D_s$ at the crystallization boundary of the crystal can be stably controlled with good responsiveness.

SUMMARY OF THE INVENTION

It is an object of the present invention to provide a method of and apparatus for controlling a floating zone of a semiconductor rod which are capable of stably controlling the diameter of a crystallizing crystal and the zone length with good responsiveness.

In order to achieve this object, in a first method of the present invention, a diameter $D_m$ of a melt shoulder portion on the crystallizing side of the floating zone is measured and the diameter $D_s$ at the crystallization boundary of the crystal is controlled indirectly by controlling the diameter $D_m$. The distance between the surfaces respectively corresponding to the diameter $D_s$ of the growing crystal and the diameter $D_m$ of the melt shoulder portion on the crystallizing side is also relatively large, and the difference between these diameters $D_s$ and $D_m$ is relatively large. Furthermore, the diameter $D_m$ of the melt shoulder portion on the crystallizing side is closely related to the diameter $D_s$ which the crystallizing crystal is expected to have after elapse of a given time. This method offers good responsiveness and stability of control and can reduce the chance of dripping of the melt, while assuring a good quality of the semiconductor monocrystal as the product.

In a first apparatus of the present invention for performing the above-described method, a difference $\Delta D$ between the diameter $D_s$ of the growing crystal and the diameter $D_m$ of the melt shoulder portion on the crystallizing side is detected and controlled to a command value $\Delta D_O$. This apparatus utilizes as a controlled variable the difference $\Delta D$ which is directly related to the dropping off of the melt and thus can prevent the occurrence of dropping off of the melt, at the same time reducing the length of the cone portion which cannot be used as a product.

In addition, in a second apparatus of the present invention for carrying out the above-described method, the diameter $D_m$ of the melt shoulder portion on the crystallizing side of the floating zone is controlled to a command value $D_{mo}$. This apparatus is able to control the cone portion and a vertical body portion in the same manner and thus simplifies the control.

A second method of the present invention indirectly controls the zone length L which is the axial length of the floating zone by measuring the diameter $D_n$ of the constricted melt portion of the floating zone and controlling this diameter $D_n$. An increment $\Delta D_n$ of $D_n$ is proportional to a decrement $\Delta L$ of L after a given time and the value of a ratio $\Delta D_n/\Delta L$ is large, so the sensitivity is high. Since the control of the zone length L is also closely related to control of the diameter $D_s$ at the crystallization boundary of the crystal, if the ability to control one of these is improved, control of the other can also be improved. This method thus exhibits good responsiveness and stability and is able to reduce the occurrence of dropping of the melt and to produce a semiconductor monocrystal of good quality.

In this second method, if the diameter $D_n$ of the constricted melt portion is controlled to be constant during the production of the cylindrical body portion of a semiconductor rod, the zone length L and the crystallizing-side zone length L1 are maintained at constant values, leading to the resolution of the above-described problems (1) to (4).

In a third method of the present invention, the zone length L is controlled directly or indirectly by adjusting the moving speed of the melting-side semiconductor rod relative to the heater, and the diameter $D_s$ at the crystallization boundary of crystal is controlled directly or indirectly by adjusting the electrical power P supplied to the heater. In this third method, the control of L and the control of $D_s$ by the above-described adjustments are interrelated to each other so that the zone length L and the diameter $D_s$ at the crystallization boundary of the crystal can be stably controlled with good responsiveness regardless of the fact that each adjustment affects both the zone length L and the diameter $D_s$ at the crystallization boundary of the crystal. In addition, since the zone length L may be controlled by adjusting the moving speed alone, while the diameter $D_s$ at the crystallization boundary of the crystal may be controlled by adjusting the electrical power P alone, the control of the floating zone can be advantageously simplified.

DESCRIPTION OF THE PREFERRED EMBODIMENT

An embodiment of the present invention will be described with reference to the drawings.

Figure 1:
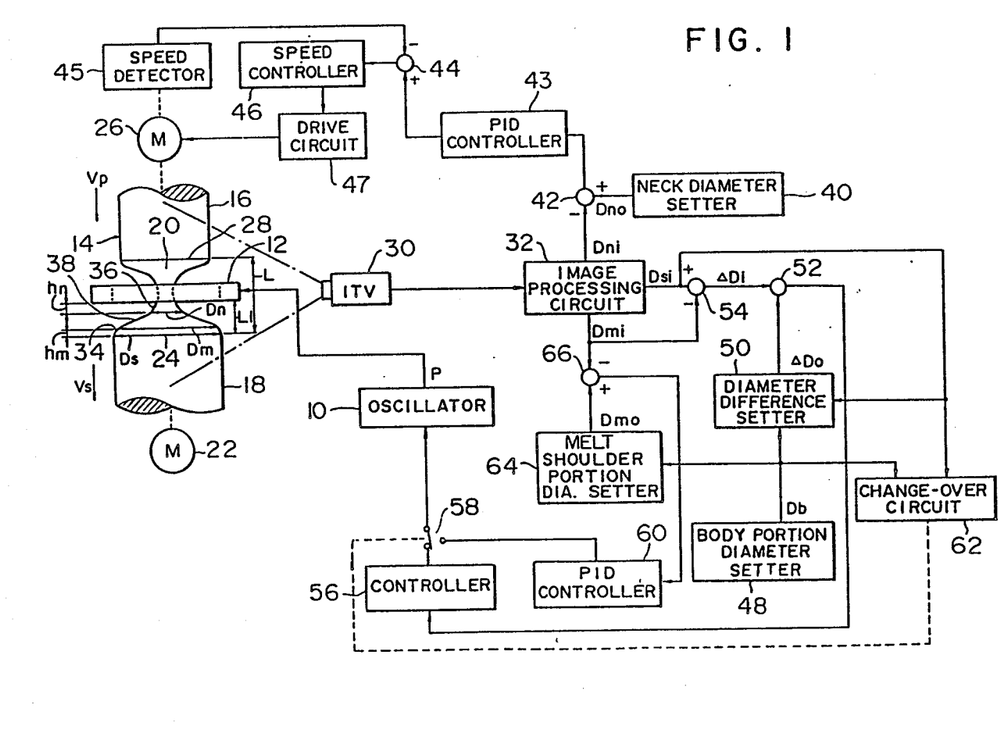
FIG. 1 is a block diagram of an apparatus for controlling a floating zone of a semiconductor rod to which an embodiment of the present invention pertains.

FIG. 1 schematically shows the whole system for controlling a floating zone in the production of a monocrystalline semiconductor rod.

An oscillator 10 supplies a high-frequency current to an induction heating coil 12 so as to form a floating zone 20 between a melting-side semiconductor rod 16 and a crystallizing-side semiconductor rod 18.

The crystallizing-side semiconductor rod 18 is vertically disposed and moved downward by an adjustable-speed motor 22 at a velocity $V_s$. The melting-side semiconductor rod 18 is also rotated around its axis by a motor (not shown) at a constant speed so that the temperature distribution of the crystallizing-side semiconductor rod 18 and the floating zone 20 is in rotation symmetry in the vicinity of a crystallization boundary 24.

On the other hand, the melting-side semiconductor rod 16 is also vertically disposed and moved downward by a lifting adjustable speed motor 26 at a velocity $V_p$. The melting-side semiconductor rod 16 is also rotated by a motor (not shown) at a constant speed so that the temperature distribution of the melting-side semiconductor rod 16 and the floating zone 20 is rotationally symmetrical in the vicinity of a melting boundary 28.

The floating zone 20 and the adjacent space thereof are monitored by a fixed industrial television camera 30, and the composite picture signals therefrom are supplied to an image processing circuit 32 so as to detect the diameter $D_s$ at the crystallization boundary 24, the diameter $D_n$ of the crystallizing-side constricted melt portion 36 of the floating zone 20, and the diameter $D_m$ of the crystallizing-side melt shoulder portion 34 between the crystallizing-side constricted melt portion 36 and the crystallization boundary 24.

The diameter $D_n$ of the constricted melt portion is the diameter of the crystallizing-side liquid neck portion 36 at a position of a given distance $h_n$ downward from the bottom surface of the induction heating coil 12.

The diameter $D_m$ of the melt shoulder portion is the diameter of the crystallizing-side melt shoulder portion 34 at a position of a given distance $h_m$ upward from the crystallization boundary 24.

Each of diameters $D_m$ and $D_n$ of the melt shoulder portion and the constricted melt portion is detected as a dimension which is proportional to the length of a portion of a horizontal scanning line with a value of luminance greater than a standard value. In addition, the positions of the crystallization boundary 24 and the bottom of the induction heating coil 12 are each detected as a position at which the luminance in the vertical direction of the scanning lines changes abruptly. The distances $h_n$ and $h_m$ correspond to horizontal scanning lines disposed at a distance of several lines from the horizontal scanning lines corresponding to the bottom of the induction heating coil 12 and the crystallization boundary 24, respectively. (Relationship between diameter $D_m$ of the melt shoulder portion and diameter $D_s$ at the crystallization boundary of the crystal)

The inventors of the present invention has found that, if the distance $h_m$ and the downward velocity $V_s$ of the crystallizing-side semiconductor rod 18 are constant, the diameter $D_m$ of the melt shoulder portion exhibits a constant relationship to the diameter $D_s$ which the crystallizing crystal is expected to have after elapse of a given time (usually 30 to 100 seconds after) and this correlation is close.

This finding is summarized as follows:

For example, if an equilibrium state has been stably obtained on condition of $D_s=101$ mm and $D_m=100$ mm, when the diameter $D_n$ of the constricted melt portion is kept constant and $D_m$ is increased from 100 mm to 102 mm, the following condition is met after a time $h_m/V_s$ has passed, $D_s=101\times 102/100=103$ mm.

In this case, since $V_s=2.6-5.0$ mm/min is generally met, the diameter $D_s$ which the growing crystal is expected to have after elapse of 36 to 69 seconds can be predicted from the diameter $D_m$ of the melt shoulder portion.

In addition, since the horizontal sectional shape is closer to a circle at the crystallizing side melt shoulder portion 34 than that at the crystallization boundary 24 due to the surface tension of the melt, the diameter of the crystal can be more correctly controlled by using the diameter $D_m$ of the melt shoulder portion rather than the diameter $D_s$ of the crystallizing crystal.

Therefore, the diameter of the crystal can be stably controlled with a rapid response by controlling the diameter $D_s$ of the crystallizing crystal indirectly by way of controlling the diameter $D_m$ of the melt shoulder portion, rather than by directly controlling the diameter $D_s$ of the crystallizing crystal.

Thus, the control of the diameter $D_m$ of the melt shoulder portion enables prevention of the dripping of the melt in the floating zone while reducing as much as possible the length of the cone portion which cannot be used as a product. During the production of the cylindrical body portion, it is possible to reduce degree of irregularity on the outer surface in the axial direction and thus to reduce the cutting margin when the body portion is later ground to a cylindrical form.

It has been found from experiments that the value of the distance $h_m$ is preferably 2 to 5 mm irrespective of the value of the diameter $D_s$ at the crystallization boundary of the crystal, and that even a value within the range of 1 to 7 mm smaller or greater than the above values can produce a desirable effect to an appreciable extent.

(Relationship between the diameter $D_n$ of the constricted melt portion and the zone length L)

The inventors of the present invention has discovered that, when $D_m$ is controlled to be constant, the diameter $D_n$ of the constricted melt portion shows a fixed relationship to the zone length L and the crystallizing-side zone length L1 after a given time has passed (usually 5 to 10 seconds after) and this correlation is close.

This finding is summarized below.

Since $D_m$ is increased as $D_n$ increases, if the electrical power supplied to the induction heating coil 12 is reduced so as to prevent an increase in $D_m$, the zone length L is also reduced. An increment $\Delta D$ of $D_n$ is proportional to a decrement $\Delta L$ of L expected to occur after elapse of a given time.

It was also found from experiments that, when the distance hn is several millimeters, the value of $\Delta Dn/\Delta l$ is about 1 and the sensitivity of $D_n$ is one order greater than that of L.

Furthermore, in a picture of the floating zone 20 and the periphery thereof taken by the industrial television camera 30, when the diameters of the semiconductor rods 16 and 18 are large, i.e. 150 mm, the lines of the crystallization boundary 24 and the melting boundary 28 are curved. These lines are also irregular owing to the presence of a crystalline facet. On the other hand, the constricted melt portion 36 involves no such problem. It is therefore preferable to use $D_n$ rather than L as the value fed back.

Consequently, particularly during the production of the cylindrical body portion, stable control can be performed by indirectly controlling the zone length L by way of controlling the diameter $D_n$ of the liquid neck portion, rather than by directly controlling the zone length L.

In addition, since control of the zone length L is closely related to control of the diameter $D_s$ at the crystallization boundary of the crystal, the ability to control one is improved when an improvement is achieved in control of the other.

Therefore, the above-described distance $h_n$ is determined with the proviso that the value of $\Delta Dn/\Delta L$ is large, e.g. the sensitivity is high, and the detected value is stable. Specifically, the constricted melt portion is preferably near its most constricted portion having the minimum diameter, and at a distance of several millimeters or less from the bottom of the induction heating coil 12. (control of the zone length)

A description is now be made of the control of the zone length L of the floating zone.

In FIG. 1, a command diameter $D_{no}$ of the constricted melt portion is set by a diameter setter 40 for the neck portion. The command diameter $D_{no}$ of the constricted melt portion gradually increases with the increase in the diameter $D_s$ of the growing crystal during the production of the cone portion, becomes constant slightly before the growth reaches the cylindrical body portion, and is substantially kept on constant during the production of the cylindrical body portion.

Signals representing the detected diameter $D_{ni}$ of the constricted melt portion and the command diameter $D_{no}$ thereof are supplied to a differential amplifier 42 from the picture processing circuit 32 and the neck diameter setter 40, respectively, and compared with each other, the result being supplied to a PID controller 43. A differential amplifier 44 compares the detected value of the rotational speed of the adjustable speed motor 26 by a speed detector 45 with the output of the PID controller 43, amplifies a difference, and supplies it as an operational signal to a speed controller 46. This speed controller controls the rotational speed of the adjustable speed motor 26 through a drive circuit 47 so as to control the diameter $D_{ni}$ of the constricted melt portion to the command diameter $D_{no}$. As a result, the zone length L and the crystallizing-side zone length L2 are controlled to be constant during the production of the cylindrical body portion.

Therefore, the production of defective products is avoided, such as those attributable to a cutting of the floating zone 20 at the constricted melt portion 36 owing to an excessive length L of the zone, an occurrence of dislocation caused by a greater crystallization speed at the center of the crystallization boundary than that of the periphery, conversely, owing to a too short length L of the zone, or a solid connection of the opposite ends of the melting-side semiconductor rod 16 and the crystallizing-side semiconductor rod 18. In addition, since the surface area exposed to the environmental atmosphere of the floating zone 20 is constant, the injection speed of gaseous impurities into the floating zone 20 from the surface thereof and the removal speed of gaseous impurities from the surface of the floating zone 20 under vacuum can be made constant, and the resistivity of the resulting crystal 18 can be thus made uniform in the axial direction.

In addition, since the detection lines of the diameter $D_{mi}$ of the melt shoulder portion and of the diameter $D_{ni}$ of the constricted melt portion are parallel, these diameters can be detected by the same device.

Furthermore, since the number of scanning lines is limited, the detection accuracy of either the diameter $D_{mi}$ of the melt shoulder portion or the diameter $D_{ni}$ of the constricted melt portion is increased by disposing the industrial television camera 30 so that the scanning lines are parallel.

(Control of the diameter of the crystallizing crystal in the cone portion)

A description is now be made of the control of the diameter $D_{si}$ of the crystallizing crystal in the cone protion.

Figure 2:
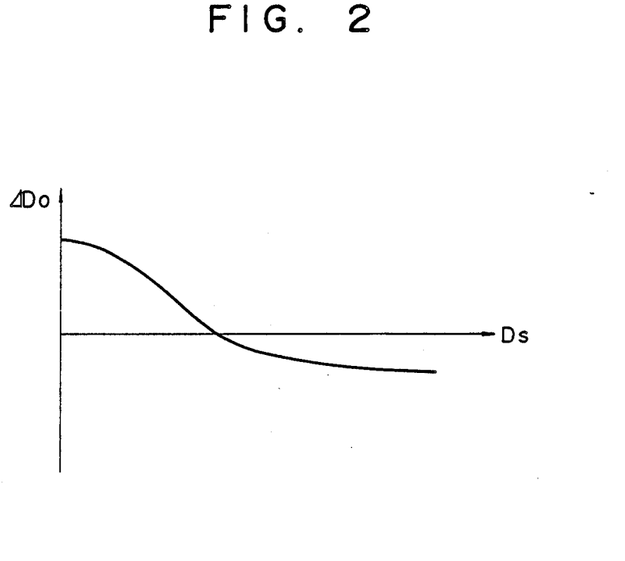
FIG. 2 is a diagram of an example of the input-output characteristic of a diameter difference setter 50 shown in FIG. 1.

A command diameter $D_b$ of the cylindrical body portion is set by a diameter setter 48 for the cylindrical body portion and supplied to a diameter difference setter 50. The diameter difference setter 50 is adapted to set a command diameter difference $\Delta D_o$ as a function of the diameter $D_s$ of the growing crystal, and FIG. 2 shows an example of such a function. A curve of the command diameter difference $\Delta D_o$ is determined by the command diameter of the cylindrical body portion supplied from the diameter setter 48 for the cylindrical body portion. The diameter difference setter 50 outputs the command diameter difference $\Delta D_o$ to a differential amplifier 52 in accordance with the detected diameter $D_{si}$ at the crystallization boundary of the crystal supplied from the image processing circuit 32.

On the other hand, the detected diameter $D_{mi}$ of the melt shoulder portion and the detected diameter $D_{si}$ at the crystallization boundary of the crystal are supplied to a subtracter 54 from the image processing circuit 32 and compared with each other, and the difference is supplied as a detected diameter difference $\Delta D_i$ to the differential amplifier 52 and compared with the command diameter difference $\Delta D_o$.

Then, a deviation of the detected diameter difference $\Delta D_i$ from the command diameter difference $\Delta D_o$ is supplied as an operational signal to a controller 56, and the output signal from the controller 56 is supplied to a control terminal of the oscillator 10 through a change-over contact 58 so as to control the electrical power P supplied from the oscillator 10 to the induction heating coil 12.

In this operation, by setting the command diameter difference $\Delta D_o$ as large as possible within the range showing no occurrence of dislocation, it is possible to commence the production of the cylindrical body portion which is a product portion without delay. However, since the larger the command diameter difference $\Delta D_o$, the greater the tendency of dripping of the melt, the input-output characteristics of the controller 56 are particularly significant and, hence, have to be adjusted carefully.

Figure 3:
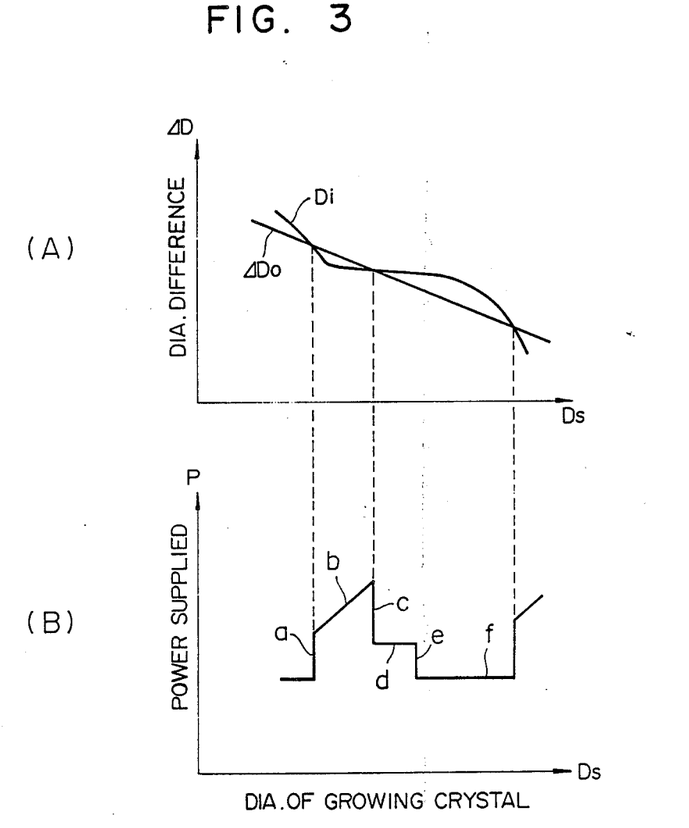
FIG. 3 is a diagram of an example of the input-output characteristic of a controller 56 shown in FIG. 1.

FIG. 3 shows an example of the relationship between the input signal of the controller 56 and the electrical power P supplied to the induction heating coil 12. In this example, at a moment when $\Delta D_i = \Delta D_o$ is met during the change from a state $\Delta D_i > \Delta D_o$ to a state $\Delta D_i < \Delta d_o$, the supply power P is stepwisely increased by a given value, as shown by (a). Thereafter, the supply power P is increased with a constant slope until $\Delta D_i = \Delta D_o$ is met, as shown by (b). The rapid response of the detected diameter difference $\Delta D_i$ is achieved by controlling the electrical power in such manners as (a) and (b).

Then, at a point of $\Delta d_i = \Delta D_o$ during the change from a state $\Delta D_i < \Delta D_o$ to a state $\Delta D > \Delta D_o$, the supply power P is stepwisely decreased by a given amount, as shown by (c). Then, during a given time, the supply power P is kept constant, as shown by (d), and if $\Delta D_i > \Delta D_o$ is met after the given time has passed, the supply power P is stepwisely reduced by a given amount, as shown by (e). Then, as shown by (f), the supply power P is kept constant for a given time during which the situations of these diameter differences are observed. If $\Delta D_i = \Delta D_o$ is met within this given time, the supply power P is stepwisely increased by a given amount as the same as (a). If $\Delta D_i = \Delta D_o$ is not met within this given time, the value of the supply power P is further stepwisely reduced by one step, as the same as (d), (e), and (f). The rapid response is achieved and the dripping of the melt is intended to be prevented by controlling the electrical power in the manners of (c) to (f).

Referring back to FIG. 1, the values of the command diameter $D_b$ of the cylindrical body portion and the detected diameter $D_{si}$ of the growing crystal are supplied to a change-over circuit 61, and when $D_{si} = D_b$ is met, the change-over contact 58 is operated to cut the connection between an output terminal of the controller 56 and an input terminal of the oscillator 10 and instead connect an output terminal of the PID controller 60 to the input terminal of the oscillator 10 whereby the control of the detected diameter Dsi of the growing crystal is commenced.

(Control of the diameter of the growing crystal in the cylindrical body portion)

A description is now be made of the control the diameter $D_s$ of the growing crystal in the cylindrical body portion.

A diameter setter 64 for the melt shoulder portion outputs a command diameter $D_{mo}$ of the melt shoulder portion which is a given value smaller than the command diameter $D_b$ of the cylindrical body portion supplied from the diameter setter 48 for the cylindrical body portion. A differential amplifier 66 compares the detected diameter $D_{mi}$ of the melt shoulder and the command diameter $D_{mo}$ of the melt shoulder portion which are respectively supplied from the image processing circuit 32 and the diameter setter 64 for the melt shoulder portion, amplifies the difference, and supplies it as an operational signal to the PID controller 60. The output signal from the PID controller 60 is supplied to the oscillator 10 through the change-over contact 58, so that the electrical power P supplied to the induction heating coil 12 is regulated and the diameter $D_{mi}$ of the melt shoulder portion is controlled to a constant value, whereby the diameter $D_{si}$ of the growing crystal is indirectly controlled to a constant value.

The cylindrical body portion as well as the cone portion can be controlled by setting the command diameter $D_{mo}$ of the melt shoulder portion as a function of the diameter $D_s$ of the growing crystal or of the length Y of the crystallizing-side semiconductor rod 18 by means of a program setter in a same manner.

In this case, the components 48 to 58 and 62 are omitted from the circuit shown in FIG. 1 and the output terminal of the PID controller 60 is connected to the control terminal of the oscillator 10. As is the case of the diameter difference setter 50, the diameter setter 64 for the melt shoulder portion is used as a program setter for the diameter $D_s$ at the crystallization boundary of the crystal or the length Y of the crystallizing-side semiconductor rod 18, and signals representing the diameter $D_s$ or the length Y is supplied to the program setter. The corresponding diameter $D_{mo}$ of the melt shoulder portion is supplied to a differential amplifier 66 from the setter. The length Y of the crystallizing-side semiconductor rod 18 is obtained by integrating the downward velocity $V_s$ of the crystallizing-side semiconductor rod 18 with respect to time elapsed.

(Control characteristic)

A descricption is now be made of the characteristics of the control of the diameter $D_s$ of the growing crystal and of the zone length L which are effected by regulating the power P supplied to the induction heating coil 12 and the downward velocity $V_p$ of the melting-side semiconductor rod (upper rod). The downward velocity $V_s$ of the crystallizing-side semiconductor rod 18 is assumed to be constant.

Figure 4:
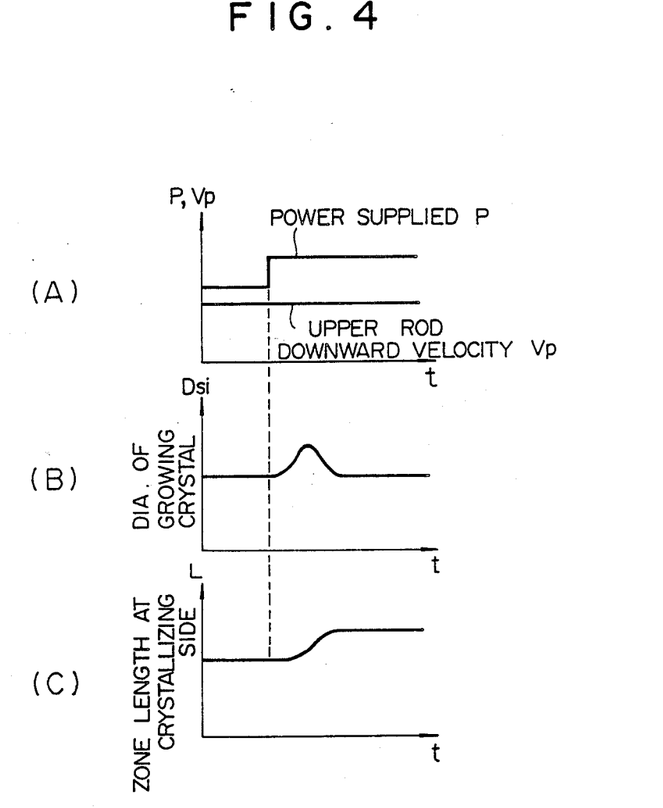
FIG. 4 is a diagram of the response characteristics of the diameter $D_s$ at a crystallization boundary of a crystal and the zone length L, as observed when an electrical power P to be supplied to the induction heating coil 12 shown in FIG. 1 is increased stepwise.

As shown in FIG. 4, if the downward velocity $V_p$ of the upper rod is constant while the supply power P is increased stepwise, the diameter $D_s$ of the growing crystal is temporarily increased. However, since the zone length L is then increased, the diameter $D_{si}$ of the growing crystal is reduced substantially to the original value. In other words, $D_{si}$ is not substantially changed by increasing the supply power P alone.

Figure 5:
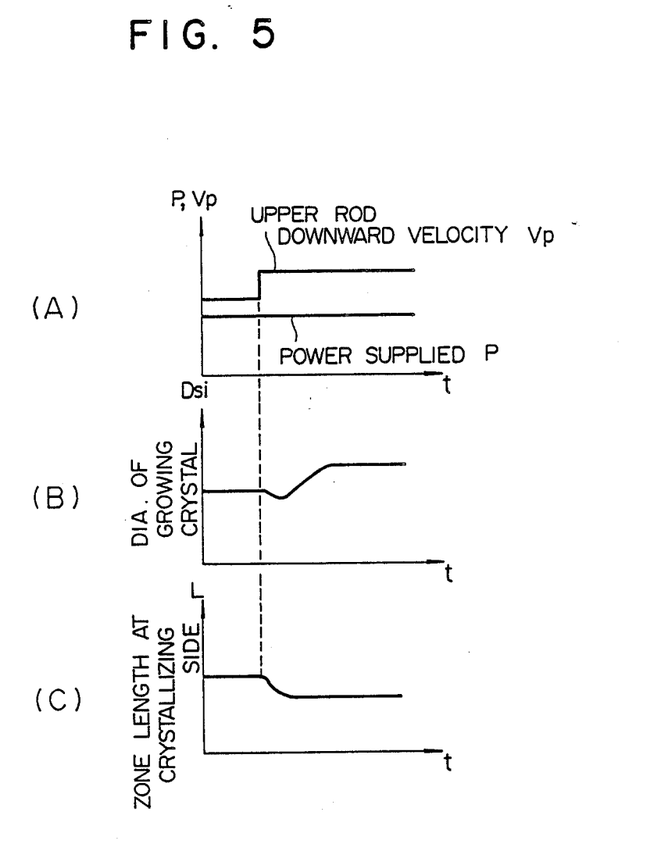
FIG. 5 is a diagram of the response characteristics of the diameter $D_s$ of a crystallizing crystal and the zone length L when a downward velocity $V_p$ of the semiconductor rod 16 on the melting side shown in FIG. 1 is increased stepwise.

FIG. 5 shows the case in which the supply power P is constant and the downward velocity $V_p$ of the upper rod is stepwisely increased. In this case, the zone length L is relatively rapidly reduced. At the same time, the diameter $D_{si}$ of the growing crystal is increased. However, an increase in the downward velocity $V_p$ of the upper rod alone, although it increases the diameter $D_{si}$ of the growing crystal, excessively reduces the zone length L to enhance the tendency of producing the crystal defects and the solid connection mentioned before.

If the supply power P is increased to extend the diameter $D_{si}$ of the growing crystal, since the zone length also is apt to increase, it is necessary to increase the downward velocity $V_p$ of the upper rod to make the zone length L constant. If the downward velocity $V_p$ of the upper rod is increased, the diameter $D_{si}$ at the crystallization boundary of the crystal also is increased, so that the supply power P must be reduced. In this manner, the control of the diameter $D_{si}$ of the growing crystal and the control of the zone length L have a complicated correlation.

However, as shown in FIG. 1, a method in which the diameter $D_{si}$ of the growing crystal is controlled by the supply power P and the zone length L is controlled by the downward velocity $V_p$ of the upper rod showed a close and desirable correlation between these two controls. In addition, the above-described advantage offered by the control of the diameter $D_m$ of the melt shoulder portion and the diameter $D_n$ of the constricted melt portion also was obtained. In consequence, the control was made at a high response speed and with good stability. Therefore, it is possible to reduce the tendency of hunting and to prevent the dripping of the melt, while ensuring good quality of the monocrystal.

Although the relationship of relative position between the vertical rotational axes of the melting-side semiconductor rod 16 and the crystallizing-side semiconductor rod 18 has not been particularly described, the two rotational axes may be common or may be offset from each other.

In addition, it is a matter of course that the industrial television camera may use a solid-state image-pickup element in place of an image pickup tube for image pickup.

What is claimed is:

1. A method of controlling a floating zone which comprises the steps of:
    supplying a high frequency current to a fixed induction heating coil to form a molten zone from a raw-material rod;
    crystallizing said molten zone from a crystallization front thereof and growing into a single crystal by axially moving said raw-material rod downward and axially moving said single crystal downward;
    imaging, with an imaging device, said molten zone having a thin portion and forming an image thereof;
    measuring from the formed image a diameter $D_{mi}$ of said molten zone at a certain 2 to 5 mm distance from the crystallization front upward; and
    controlling at least one of either electric power P supplied to said induction heating coil or speed $V_p$ of movement of said raw-material rod so as to limit said measured diameter $D_{mi}$ towards a desired value $D_{mo}$.

2. A method of controlling a floating zone which comprises the steps of:

supplying a high frequency current to a fixed induction heating coil to form a molten zone from a raw-material rod 16;

crystallizing said molten zone from a crystallization front thereof and growing into a single crystal by axially moving said raw-material rod downward and axially moving said single crystal downward;

imaging, with an imaging device, said molten zone having a thin portion and forming an image thereof;

measuring from the formed image a diameter $D_{si}$ of said molten zone at the crystallization front and a diameter $D_{mi}$ of said molten zone at a certain 2 to 5 mm distance from the crystallization front upward; and controlling at least one of either electric power P supplied to said induction heating coil or speed $V_p$ of movement of of said raw-material rod responsive to the measured diameters $D_{si}$ and $D_{mi}$ so as to limit the difference $\Delta D_i$ between said two measured diameters $D_{si}$, $D_{mi}$ towards a desired value $\Delta D_o$.

3. A method of controlling a floating zone which comprises:

supplying a high frequency current to a fixed induction heating coil to form a molten zone from a raw-material rod;

crystallizing said molten zone from a crystallization front and growing into a single crystal by axially moving said raw-material rod downward and axially moving said single crystal downward;

imaging, with an imaging device, said molten zone having a thin portion and forming an image thereof;

measuring from the formed image a diameter $D_{ni}$ of said thin portion near a lower-side surface of said induction heating coil and at a certain distance from said surface; and controlling at least one of either electric power P supplied to said induction heating coil or speed $V_p$ of movement of said raw-material rod responsive to the measured diameter $D_{ni}$ so as to limit said measured diameter $D_{ni}$ towards a desired value $D_{no}$.

4. A method according to claim 3, wherein said measured diameter $D_{ni}$ is a diameter at a certain several mm distance from said surface of said induction heating coil downward.

5. A method of controlling a floating zone which comprises:

supplying a high frequency current to a fixed induction heating coil to form a molten zone from a raw material rod;

crystallizing said molten zone 20 from a crystallization front and growing into a single crystal by axially moving said raw-material rod downward and axially moving said single crystal downward;

imaging, with an imaging device, said molten zone having a thin portion and forming an image thereof;

measuring from the formed image any one $Z_i$ of an axial length L of said molten zone, a distance L1 between said induction heating coil and the crystallization front and a diameter $D_{ni}$ of said thin portion near a crystallizing-side surface of said induction heating coil and at a certain distance from said surface and a diameter $D_i$ of said molten zone with 5 mm from said crystallization front upward; and controlling speed $V_p$ of movement of said raw-material rod responsive to the measured part $Z_i$ so as to limit said part $Z_i$ measured towards a desired value and, independently of this control, controlling electric power P supplied to said induction heating coil responsive to the measured diameter $D_i$ so as to limit said measured $D_i$ towards a desired value.

6. A method according to claim 5, wherein said measured diameter $D_{ni}$ of said thin portion is a diameter at a certain several mm distance from said surface of said induction heating coil downward.

7. An apparatus for controlling a floating zone which comprises:

a fixed induction heating coil supplied with a high frequency current to form a molten zone from a raw-material rod;

raw-material rod-moving means for axially moving said raw-material rod downward;

a single crystal moving means for axially moving a single crystal downward, said single crystal being crystallized from a molten crystallization front and grown to a rod;

an imaging device for imaging said molten zone having a thin portion and outputting a picture signal;

a diameter measuring means for detecting a crystallization front from said picture signal and measuring a diameter $D_{mi}$ of said molten zone at a certain 2 to 5 mm distance from the crystallization front upward;

a desired value-setting means for setting a desired value $D_{mo}$ of said diameter $D_{mi}$; and control means for controlling at least one of either electric power P supplied to said induction heating coil or speed $V_p$ of movement of said raw-material rod responsive to said diameter measured by said measuring means so as to limit said measured diameter $D_{mi}$ towards said desired value $D_{mo}$.

8. An apparatus for controlling a floating zone which comprises:

a fixed induction heating coil supplied with a high frequency current to form a molten zone from a raw-material rod;

raw-material rod-moving means for axially moving said raw-material rod downward;

a single crystal moving means for axially moving a single crystal downward, said single crystal being crystallized from a molten crystallization front and grown to a rod;

an imaging device for imaging said molten zone having a thin portion and outputting a picture signal;

a diameter measuring means for detecting a crystallization front from said picture signal and measuring a diameter $D_s$ at said crystallization front and a diameter $D_{mi}$ of said molten zone at a certain 2 to 5 mm distance from the crystallization front upward;

a desired value-setting means for setting a desired value $\Delta D_o$ of a difference $\Delta D_i$ between said two measured diameters $D_{si}$, $D_{mi}$; and control means for controlling al least one of either electric power P supplied to said induction heating coil or speed $V_p$ of movement of said raw-material rod responsive to said induction heating coil responsive to said diameter measured by said measuring means so as to limit said difference $\Delta D_i$ towards said desired value $\Delta D_o$.

9. An apparatus for controlling a floating zone which comprises:

a fixed induction heating coil supplied with a high frequency current to form a molten zone from a raw-material rod;

raw-material rod-moving means for axially moving said raw-material rod downward;

a single crystal moving means for axially moving a single crystal downward, said single crystal being crystallized from a molten crystallization front and grown to a rod;

an imaging device for imaging said molten zone having a thin portion and outputting a picture signal;

a diameter measuring means for detecting a crystallizing-side surface of said induction heating coil and measuring a diameter $D_{ni}$ of said thin portion near said surface and at a certain distance from said surface downward from said picture signal;

a desired value-setting means for setting a desired value $D_{no}$ of said diameter $D_{ni}$; and control means for controlling at least one of either electric power P supplied to said induction heating coil or speed $V_p$ of movement of said raw-material rod responsive to said diameter measured by said measuring meansso as to limit said measured diameter $D_{ni}$ towards said desired value $D_{no}$.

10. An apparatus according to claim 9, wherein said measured diameter $D_{ni}$ is a diameter at a certain several mm distance from said surface of said induction heating coil downward.

11. An apparatus for controlling a floating zone which comprises:

a fixed induction heating coil supplied with a high frequency current to form a molten zone from a raw-material rod;

raw-material rod-moving means for axially moving said raw-material rod downward;

a single crystal moving means for axially moving a single crystal downward, said single crystal being crystallized from a molten crystallization front and grown to a rod;

an imaging device for imaging said molten zone having a thin portion and outputting a picture signal;

a measuring means for measuring from said picture signal any one $Z_i$ of an axial length L of said molten zone, a distance L1 between said induction heating coil and a crystallization front and a diameter $D_{ni}$ of said thin portion near a crystallizing side surface of said induction heating coil at a certain distance from said surface and a diameter $D_i$ of said molten zone within 5 mm from said crystallization front upward;

a desired value-setting means for setting desired values $Z_o$ and $D_o$ of said part $Z_i$ and $D_i$; and control means for controlling speed $V_p$ of movement of said raw-material rod responsive to the measured part $Z_i$, so as to limit said part $Z_i$ measured towards said desired value $Z_o$ and , independently of this control, controlling electric power P supplied to said induction heating coil responsive to said measured diameter $D_i$ measured by said measuring means so as to limit said $D_i$ measured towards said desired value $D_o$.

12. An apparatus according to claim 11, wherein said measured diameter $D_{ni}$ of said thin portion is a diameter at a certain several mm distance from said surface of said induction heating coil downward.

* * * * *